United States Patent
Amano et al.

(10) Patent No.: US 12,142,496 B2
(45) Date of Patent: Nov. 12, 2024

(54) SUBSTRATE PROCESSING APPARATUS AND SUBSTRATE PROCESSING METHOD

(71) Applicant: Tokyo Electron Limited, Tokyo (JP)

(72) Inventors: Yoshifumi Amano, Koshi (JP); Kazuhiro Aiura, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1072 days.

(21) Appl. No.: 15/930,561

(22) Filed: May 13, 2020

(65) Prior Publication Data

US 2020/0365422 A1 Nov. 19, 2020

(30) Foreign Application Priority Data

May 14, 2019 (JP) ................ 2019-091600

(51) Int. Cl.
*H01L 21/67* (2006.01)
*B05B 9/00* (2006.01)
*B05C 5/02* (2006.01)
*B05C 11/10* (2006.01)
*H01L 21/68* (2006.01)

(52) U.S. Cl.
CPC ........... *H01L 21/6708* (2013.01); *B05B 9/00* (2013.01); *B05C 5/0204* (2013.01); *B05C 11/1013* (2013.01); *H01L 21/67051* (2013.01); *H01L 21/67253* (2013.01); *H01L 21/67259* (2013.01); *H01L 21/68* (2013.01)

(58) Field of Classification Search
CPC ........... H01L 21/6708; H01L 21/67051; H01L 21/67253; H01L 21/67259; H01L 21/68; B05C 5/0204; B05C 11/08; B05C 11/1013
See application file for complete search history.

(56) References Cited

U.S. PATENT DOCUMENTS

| | | | |
|---|---|---|---|
| 6,857,838 B2* | 2/2005 | Kuroda | H01L 21/681 414/935 |
| 2008/0226830 A1* | 9/2008 | Miyagi | H01L 21/67706 118/620 |
| 2013/0206726 A1* | 8/2013 | Oono | H01L 21/67253 216/85 |

FOREIGN PATENT DOCUMENTS

| | | | |
|---|---|---|---|
| JP | 2006060161 A | * | 3/2006 |
| JP | 2013-168429 A | | 8/2013 |
| KR | 10-2018-0127217 A | | 11/2018 |

* cited by examiner

*Primary Examiner* — Dah-Wei D. Yuan
*Assistant Examiner* — Stephen A Kitt
(74) *Attorney, Agent, or Firm* — Pearne & Gordon LLP

(57) ABSTRACT

A substrate processing apparatus includes a holder, a nozzle arm and a position adjusting device. The holder is configured to hold a substrate. The nozzle arm has a nozzle configured to supply a processing liquid to a peripheral portion of the substrate. The position adjusting device is provided at the nozzle arm and is configured to adjust a position of the substrate to a given position on the holder.

21 Claims, 11 Drawing Sheets

SUBSTRATE PROCESSING APPARATUS AND SUBSTRATE PROCESSING METHOD

CROSS-REFERENCE TO RELATED APPLICATION

This application claims the benefit of Japanese Patent Application No. 2019-091600 filed on May 14, 2019, the entire disclosure of which is incorporated herein by reference.

TECHNICAL FIELD

The various aspects and embodiments described herein pertain generally to a substrate processing apparatus and a substrate processing method.

BACKGROUND

Conventionally, there is known a technique of etching a peripheral portion of a substrate such as a semiconductor wafer (hereinafter, simply referred to as "wafer") by a processing liquid.
Patent Document 1: Japanese Patent Laid-open Publication No. 2013-168429

SUMMARY

In one exemplary embodiment, a substrate processing apparatus includes a holder, a nozzle arm and a position adjusting device. The holder is configured to hold a substrate. The nozzle arm has a nozzle configured to supply a processing liquid to a peripheral portion of the substrate. The position adjusting device is provided at the nozzle arm and is configured to adjust a position of the substrate to a given position on the holder.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
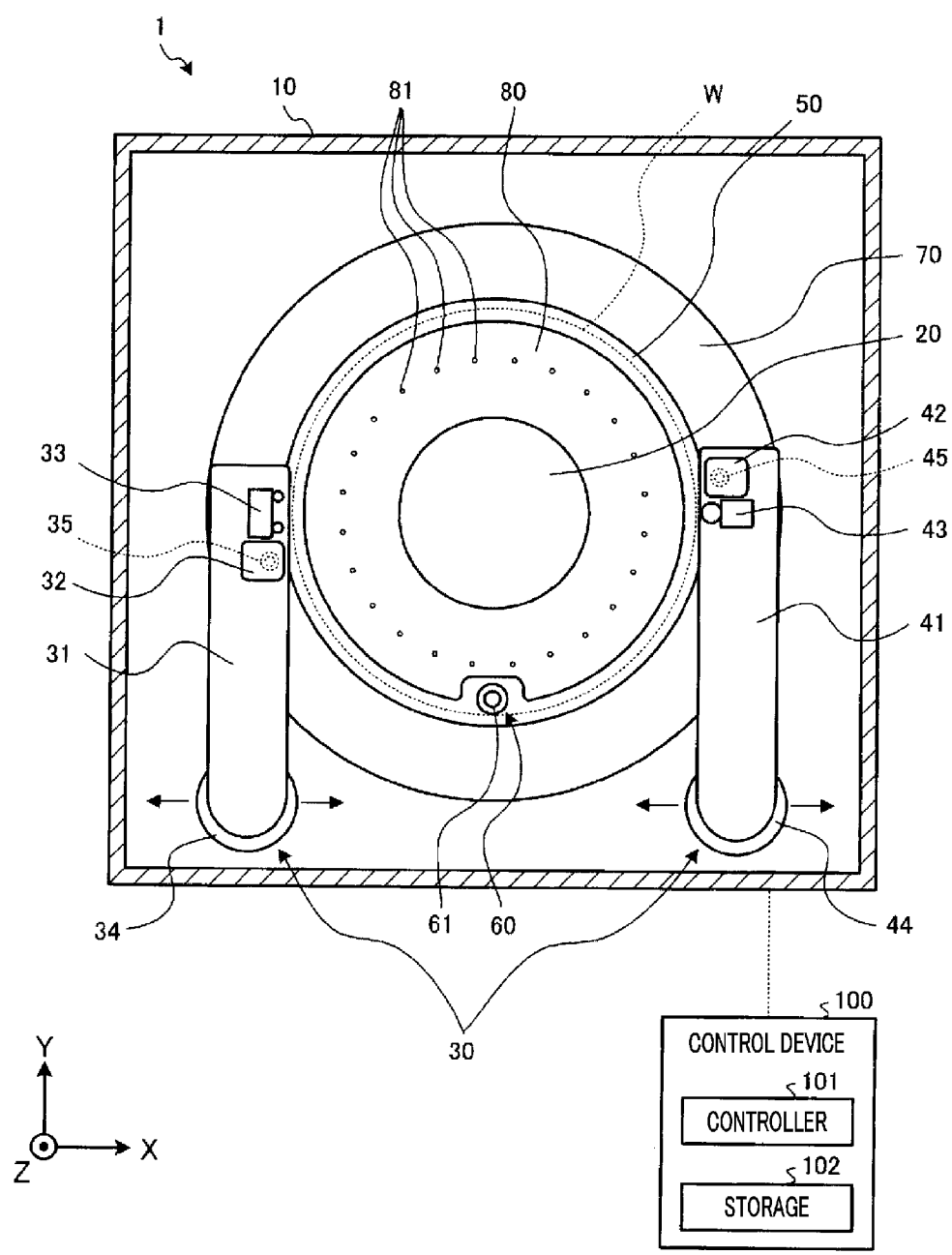
FIG. 1 is a schematic diagram illustrating a configuration of a substrate processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments of a substrate processing apparatus and a substrate processing method of the present disclosure will be described in detail with reference to the accompanying drawings. The present disclosure is not limited to the exemplary embodiments to be described below. Further, it should be noted that the drawings are schematic and relations in sizes of individual components and ratios of the individual components may sometimes be different from actual values. Even between the drawings, there may exist parts having different dimensional relationships or different ratios.

Furthermore, in the various exemplary embodiments, same parts will be assigned same reference numerals, and redundant description will be omitted. In the various drawings, for the convenience of explanation, the X-axis, Y-axis and Z-axis which are orthogonal to each other will be defined, and an orthogonal coordinates system where the positive Z-axis direction is set as a vertically upward direction may be used. Further, a rotational direction around a vertical axis will be sometimes referred to as "θ direction."

Conventionally, there is known a technique of etching a peripheral portion of a substrate such as a semiconductor wafer (hereinafter, simply referred to as "wafer") by a processing liquid. In this etching of the peripheral portion of the substrate, it is important to align the substrate to a holder accurately lest the substrate should be placed eccentrically with respect to the holder.

Meanwhile, in a conventional substrate processing apparatus, since a position adjusting device configured to adjust a position of the substrate and a nozzle configured to discharge the processing liquid to the substrate are provided at individual arms separately, there is caused non-uniformity in a relative position of the nozzle with respect to the position adjusting device.

Thus, even if the position of the substrate is adjusted accurately by the position adjusting device, the processing liquid may not be discharged to the peripheral portion of the substrate accurately. In such a case, it is difficult to etch the peripheral portion of the substrate accurately.

In this regard, there is a demand for a technique capable of etching the peripheral portion of the substrate with high accuracy by solving the foregoing problems.

<Overall Configuration of Substrate Processing Apparatus>

Figure 2:
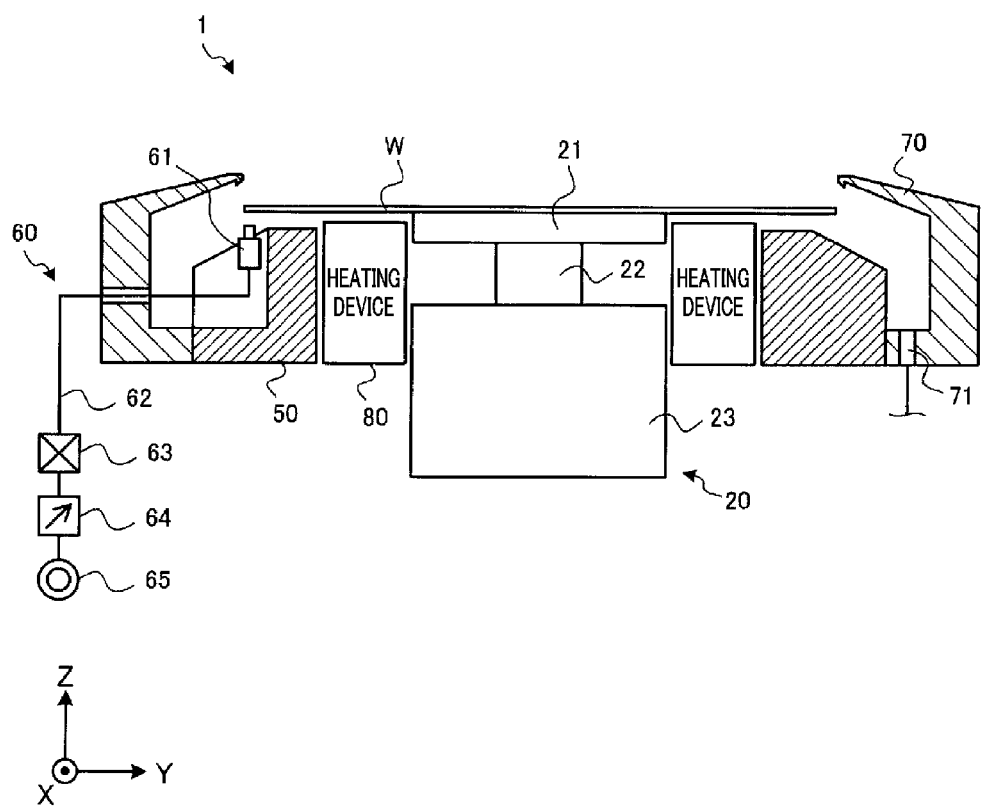
FIG. 2 is a schematic diagram illustrating the configuration of the substrate processing apparatus according to the exemplary embodiment.

First, a configuration of a substrate processing apparatus 1 according to an exemplary embodiment will be described with reference to FIG. 1 and FIG. 2. FIG. 1 and FIG. 2 are schematic diagrams illustrating the configuration of the substrate processing apparatus 1 according to the exemplary embodiment.

As depicted in FIG. 1 and FIG. 2, the substrate processing apparatus 1 according to the exemplary embodiment is equipped with a processing vessel 10, a holder 20, a top surface supply 30, a lower cup 50, a bottom surface supply 60, an outer cup 70 and a heating device 80.

The processing vessel 10 accommodates therein the holder 20, the top surface supply 30, the lower cup 50, the bottom surface supply 60, the outer cup 70 and the heating device 80.

The holder 20 is configured to hold the wafer W rotatably and move the held wafer W up and down. To elaborate, as shown in FIG. 2, the holder 20 is equipped with a vacuum chuck 21, a shaft 22 and a driving unit 23. The vacuum chuck 21 is configured to attract and hold the wafer W by evacuation. The vacuum chuck 21 has a diameter smaller than a diameter of the wafer W and attracts and holds a central portion of a bottom surface of the wafer W.

The shaft 22 holds the vacuum chuck 21 horizontally on a leading end thereof. The driving unit 23 is connected to a base end of the shaft 22. The driving unit 23 is configured to rotate the shaft 22 around a vertical axis, and move the shaft 22 and the vacuum chuck 21 held by the shaft 22 up and down. With this configuration, the driving unit 23 is capable of rotating the wafer W held by the vacuum chuck 21 and, also, capable of moving this wafer W up and down.

As illustrated in FIG. 1, the top surface supply 30 is configured to supply a processing liquid onto a top surface peripheral portion of the wafer W, thus allowing the top surface peripheral portion of the wafer W to be etched. Accordingly, a film formed on the top surface peripheral portion of the wafer W can be removed, or the top surface peripheral portion of the wafer W can be cleaned, for example.

Here, the top surface peripheral portion of the wafer W is an annular region having a width of, e.g., 1 mm to 5 mm from an edge of a top surface of the wafer W.

The top surface supply 30 is equipped with a nozzle arm 31 and a nozzle arm 41. The nozzle arm 31 and the nozzle arm 41 are disposed to face each other with the holder 20 therebetween, when viewed from the top.

The nozzle arm 31 is equipped with a liquid supply 32, a position adjusting device 33 and a moving device 34. The nozzle arm 31 extends in a horizontal direction (here, the Y-axis direction), and supports the liquid supply 32 and the position adjusting device 33 at a leading end thereof.

The liquid supply 32 is equipped with a nozzle 35, and supplies a processing liquid such as a chemical liquid or a rinse liquid to this nozzle 35. The chemical liquid may be, by way of non-limiting example, hydrofluoric acid (HF), dilute hydrofluoric acid (DHF), nitrohydrofluoric acid, or the like. The nitrohydrofluoric acid is a mixed solution of hydrofluoric acid (HF) and nitric acid ($HNO_3$). By way of example, deionized water (DIW) may be used as the rinse liquid.

The position adjusting device 33 is configured to align a position of the wafer W to a given position on the holder 20. In the present disclosure, "given" means "previously determined." For example, the position adjusting device 33 aligns a center C2 (see FIG. 5) of the wafer W with a center C1 (see FIG. 5) of a rotation shaft of the holder 20.

Accordingly, in the present exemplary embodiment, the wafer W can be placed on the holder 20 with high accuracy lest the wafer W should be placed eccentrically with respect to the holder 20. Details of this position adjusting device 33 will be elaborated later.

The moving device 34 is connected to a base end of the nozzle arm 31. The moving device 34 is configured to move the nozzle arm 31 in, for example, a horizontal direction (here, the X-axis direction) and, also, move the nozzle arm 31 up and down. The nozzle 35 is placed above the wafer W with a discharge opening thereof facing downwards, and discharges the processing liquid onto the top surface of the wafer W.

The nozzle arm 41 is equipped with a liquid supply 42, a position adjusting device 43 and a moving device 44. The nozzle arm 41 extends in the horizontal direction (here, the Y-axis direction), and supports the liquid supply 42 and the position adjusting device 43 at a leading end thereof. The liquid supply 42 has a nozzle 45 and supplies the processing liquid to this nozzle 45.

The position adjusting device 43 is configured to adjust the position of the wafer W to the given position on the holder 20. By way of example, the position adjusting device 43 aligns the center C2 of the wafer W to the center C1 of the rotation shaft of the holder 20. Accordingly, in the present exemplary embodiment, the wafer W can be placed on the holder 20 accurately lest it should be eccentric. Details of this position adjusting device 43 will be elaborated later.

The moving device 44 is connected to a base end of the nozzle arm 41. The moving device 44 is configured to move the nozzle arm 41 in, for example, the horizontal direction (here, the X-axis direction) and, also, move the nozzle arm 41 up and down. The nozzle 45 is placed above the wafer W with a discharge opening thereof facing downwards, and discharges the processing liquid onto the top surface of the wafer W.

The lower cup 50 is a circular ring-shaped member disposed at an outside of the heating device 80 to cover a space under a peripheral portion of the wafer W. The lower cup 50 is formed of a member having high chemical resistance such as, but not limited to, a fluorine resin such as perfluoroalkoxy alkane (PFA) or polytetrafluoroethylene (PTFE).

The bottom surface supply 60 is configured to supply the processing liquid onto a bottom surface peripheral portion of the wafer W, thus allowing the bottom surface peripheral portion to be etched. Accordingly, a film formed on the bottom surface peripheral portion of the wafer W can be removed, or the bottom surface peripheral portion of the wafer W can be cleaned, for example.

Here, the bottom surface peripheral portion of the wafer W refers to an annular region having a width of, e.g., 1 mm to 5 mm from an edge of a bottom surface of the wafer W.

As depicted in FIG. 2, the bottom surface supply 60 is equipped with a bottom surface nozzle 61, a pipeline 62, a valve 63, a flow rate controller 64 and a processing liquid source 65. The bottom surface nozzle 61 is disposed under the wafer W and discharges the processing liquid toward the bottom surface peripheral portion of the wafer W.

The pipeline 62 connects the bottom surface nozzle 61 and the processing liquid source 65. The valve 63 is provided at a portion of the pipeline 62 to open or close the pipeline 62. The flow rate controller 64 is provided at a portion of the pipeline 62 to adjust a flow rate of the processing liquid flowing in the pipeline 62. The processing liquid source 65 is, for example, a tank in which the processing liquid is stored.

Further, the bottom surface supply 60 may be equipped with a moving device configured to move the bottom surface nozzle 61 in the horizontal direction. With this configuration, the bottom surface supply 60 is capable of moving the bottom surface nozzle 61 between a processing position under the wafer W and a retreat position at an outer side than the wafer W.

The outer cup 70 is an annular member disposed to surround the wafer W and configured to receive the processing liquid or the like scattered from the wafer W. The outer cup 70 is made of the same material as that of the lower cup 50 which has the high chemical resistance.

A liquid drain port 71 is formed at a bottom of the outer cup 70. The processing liquid or the like received by the outer cup 70 is drained to an outside of the substrate processing apparatus 1 through the liquid drain port 71 after being collected in a space formed by the outer cup 70 and the lower cup 50.

The heating device 80 is disposed under the wafer W at an outer side than the holder 20. To be specific, the heating device 80 is disposed between the holder 20 and the lower cup 50.

The heating device 80 is configured to heat the bottom surface peripheral portion of the wafer W by supplying a heated fluid to the bottom surface of the wafer W held by the holder 20. To elaborate, as shown in FIG. 1, the heating device 80 has a multiple number of discharge openings 81 which are arranged in a circumferential direction of the wafer W, and the heated fluid is supplied to the bottom surface of the wafer W from these discharge openings 81.

Further, the substrate processing apparatus 1 according to the exemplary embodiment is equipped with a control device 100. The control device 100 is, for example, a computer, and includes a controller 101 and a storage 102.

The storage 102 is implemented by, by way of example, but not limitation, a semiconductor memory device such as a RAM or a flash memory, or a storage device such as a hard disk or an optical disk. The storage 102 stores therein a program for controlling various processings performed in the substrate processing apparatus 1.

The controller 101 includes various circuits and a microcomputer having a CPU (Central Processing Unit), a ROM (Read Only Memory), a RAM, an input/output port, and so forth. The controller 101 controls an operation of the substrate processing apparatus 1 by reading out and executing the program stored in the storage 102.

Further, this program may be recorded on a computer-readable recording medium and installed from the recording medium to the storage 102 of the control device 100. The computer-readable recording medium may be, for example, a hard disc (HD), a flexible disc (FD), a compact disc (CD), a magnet optical disc (MO), or a memory card.

<Configurations and Operations of Nozzle Arms>

Figure 3:
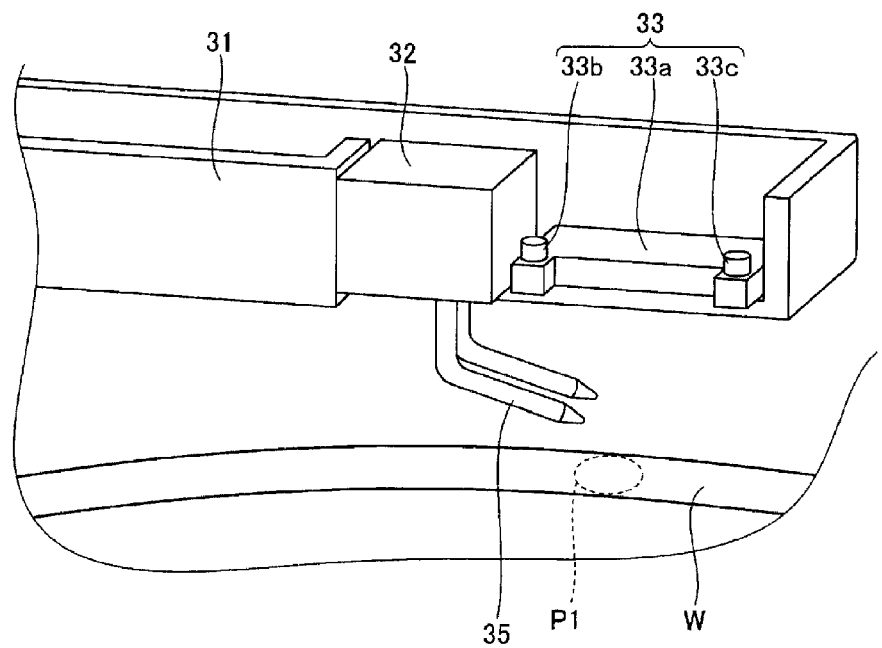
FIG. 3 is a perspective view illustrating a configuration of a nozzle arm according to the exemplary embodiment.

Now, configurations and operations of the nozzle arm 31 and the nozzle arm 41 will be explained with reference to FIG. 3 to FIG. 5. FIG. 3 is a perspective view illustrating a configuration of the nozzle arm 31 according to the exemplary embodiment.

As depicted in FIG. 3, the position adjusting device 33 has a main body 33a and two rollers 33b and 33c. The main body 33a is supported at the nozzle arm 31 and supports the rollers 33b and 33c.

The rollers 33b and 33c are disposed substantially horizontally to each other and arranged along the circumferential direction of the wafer W. Accordingly, the main body 33a is capable of bringing side surfaces of the rollers 33b and 33c into contact with an end surface of the wafer W.

The nozzle 35 is disposed to extend from the liquid supply 32, which is located next to the position adjusting device 33, to below the position adjusting device 33. That is, the nozzle 35 is positioned under the position adjusting device 33. A detailed configuration of this nozzle 35 will be described later in detail.

Figure 4:
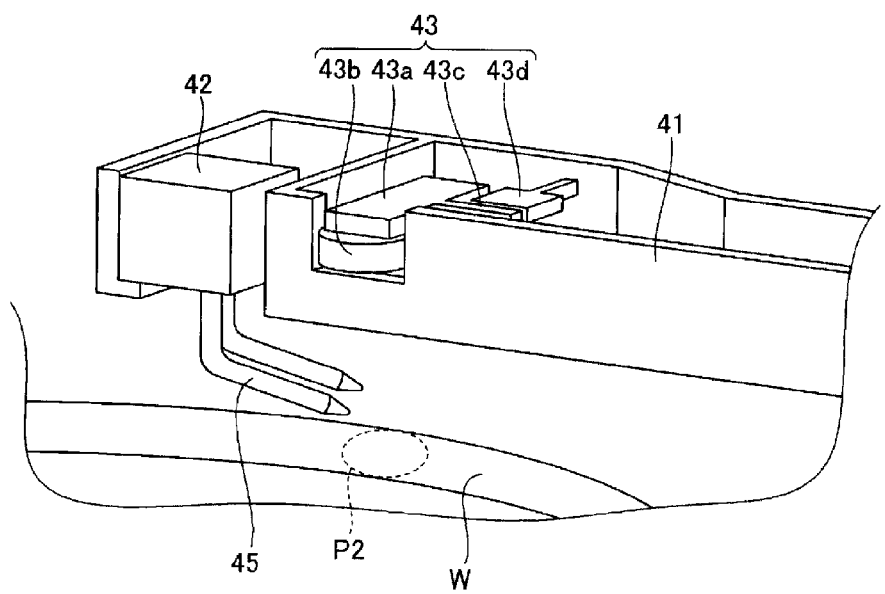
FIG. 4 is a perspective view illustrating the configuration of the nozzle arm according to the exemplary embodiment.

FIG. 4 is a perspective view illustrating a configuration of the nozzle arm 41 according to the exemplary embodiment. As shown in FIG. 4, the position adjusting device 43 includes a main body 43a, a roller 43b, a plate member 43c and a sensor 43d.

The main body 43a is supported by the nozzle arm 41 to be movable along a diametrical direction of the wafer W, and supports the roller 43b. Further, the main body 43a is capable of bringing a side surface of the roller 43b into contact with the end surface of the wafer W.

The plate member 43c is of a substantially plate shape and extends from the main body 43a in a direction orthogonal to the diametrical direction of the wafer W. The sensor 43d is disposed to face a single main surface of the plate member 43c and configured to measure a distance D (see FIG. 5) from the plate member 43c.

The nozzle 45 is disposed to extend from the liquid supply 42, which is located next to the position adjusting device 43, to below the position adjusting device 43. That is, the nozzle 45 is located under the position adjusting device 43. Further, the nozzle 45 has the same configuration as the nozzle 35.

Figure 5:
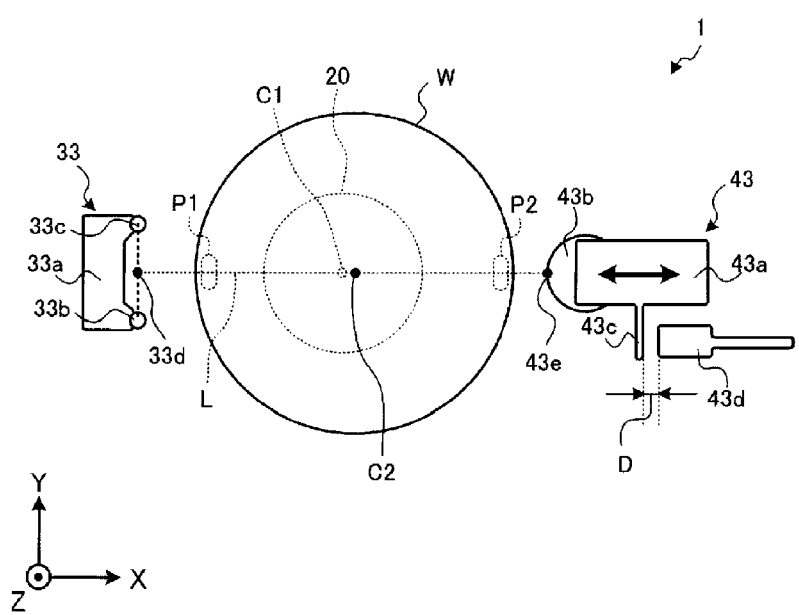
FIG. 5 is a diagram for describing an operation of a position adjusting device according to the exemplary embodiment.

FIG. 5 is a diagram for describing operations of the position adjusting devices 33 and 43 according to the exemplary embodiment. In FIG. 5, to ease understanding, sizes of the position adjusting devices 33 and 43 are enlarged as compared to those of the wafer W and the holder 20.

As depicted in FIG. 5, in the substrate processing apparatus 1, the position adjusting device 33 and the position adjusting device 43 are disposed to face each other with the holder 20 therebetween. Further, a midway point 33d between the roller 33b and the roller 33c in the position adjusting device 33 and a leading end 43e of the roller 43b in the position adjusting device 43 lie on an imaginary line L passing through the center C1 of the rotation shaft of the holder 20.

When placing the wafer W to be processed on the holder 20, a transfer arm 90 (see FIG. 6A) puts the center C2 of the wafer W on the imaginary line L. Accordingly, as the wafer W is moved along the imaginary line L by using the position adjusting device 33 and the position adjusting device 43 which face each other with the wafer W therebetween, the center C2 of the wafer W is aligned to the center C1 of the holder 20.

Meanwhile, since the wafer W has a tolerance of, e.g., about a diameter ±0.2 mm due to a fabrication error or the like, a distance from the side surface of the wafer W, with which the position adjusting device 33 (43) comes into contact, to the center C2 of the wafer W may be varied depending on the wafer W.

Thus, if the position adjustment is carried out on the assumption that all wafers W have the same diameter, the center C2 of the wafer W may not coincide with the center C1 of the holder 20.

As a resolution, in the exemplary embodiment, the diameter of the wafer W is measured by using the sensor 43d when the position adjustment of the wafer W is performed. In the exemplary embodiment, a reference wafer whose diameter is previously detected with high accuracy is placed between the position adjusting device 33 and the position adjusting device 43.

The controller 101 stores, in the storage 102, as a reference distance, the distance D between the plate member 43c and the sensor 43d measured when this reference wafer is placed between the position adjusting devices 33 and 43.

Then, when the position adjustment of the wafer W to be etched with respect to the holder 20 is performed, the controller 101 measures the distance D between the plate member 43c and the sensor 43d, and evaluates a difference between the measured distance D and the reference distance. Accordingly, the controller 101 is capable of estimating the diameter of the wafer W based on the difference from the reference distance.

By way of example, assume that the reference wafer has a diameter of 300.0 mm, and the reference distance between the plate member 43c and the sensor 43d is 1.0 mm. If the measured distance D between the plate member 43c and the sensor 43d is 1.1 mm for a certain wafer W, a diameter of this wafer W is estimated to be smaller than 300.0, that is, 299.9 mm.

Likewise, if the measured distance D between the plate member 43c and the sensor 43d is 0.9 mm for another wafer W, a diameter of this wafer W is estimated to be larger than 300.0 mm, that is, 300.1 mm.

Furthermore, if the estimated diameter of the wafer W is out of a tolerance range, the controller 101 may make a determination that the rollers 33b and 33c of the position adjusting device 33 or the roller 43b of the position adjusting device 43 has come into contact with a notch or an orientation flat of the wafer W.

In this case, the controller 101 may control the holder 20 to rotate the wafer W, and estimate the diameter of the wafer W again at a different position in the circumferential direction.

Further, in the exemplary embodiment, as shown in FIG. 5, the rollers 33b and 33c of the position adjusting device 33 have a diameter smaller than that of the roller 43b of the position adjusting device 43. By setting the rollers 33b and 33c to have such a small diameter, the rollers 33b and 33c are allowed to enter the inside of the notch or the orientation flat of the wafer W when they come into contact with the notch or the orientation flat.

Thus, according to the exemplary embodiment, as the rollers 33b and 33c are allowed to be moved largely within the notch or the like, it is more accurately determined that the rollers 33b and 33c come into contact with the notch or the orientation flat.

Further, in the exemplary embodiment, when the diameter of the wafer W is estimated, the wafer W may be rotated by the holder 20, and the diameter of the wafer W may be estimated at different positions in the circumferential direction. In this way, by estimating the diameter of the wafer W at the multiple positions thereof, it can be found out whether the wafer W is a perfect circle.

If it is found out that the wafer W is not a perfect circle, there may be a concern that the peripheral portion of the wafer W may not be processed in an annular region having the same width. Thus, the fact that the wafer W is not the perfect circle needs to be notified to a user through an alarm or the like.

<Details of Substrate Processing>

Now, details of a substrate processing according to the exemplary embodiment will be described with reference to FIG. 6A to FIG. 6F. FIG. 6A to FIG. 6F are schematic diagrams illustrating individual processes of the substrate processing according to the exemplary embodiment.

Figure 6A:
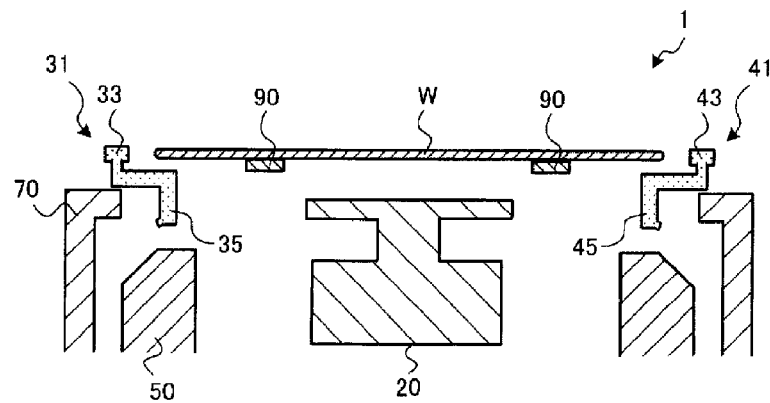
FIG. 6A is a schematic diagram illustrating a process of a substrate processing according to the exemplary embodiment.

First, as shown in FIG. 6A, by using the transfer arm 90, the substrate processing apparatus 1 carries the wafer W into the processing vessel 10 (see FIG. 1) and moves the wafer W to above the holder 20.

At this time, the substrate processing apparatus 1 retreats the holder 20 and the nozzle arms 31 and 41 to positions where they do not interfere with the wafer W. To elaborate, the substrate processing apparatus 1 moves the holder 20 to a lowered position, and moves the nozzle arms 31 and 41 to outer positions.

Figure 6B:
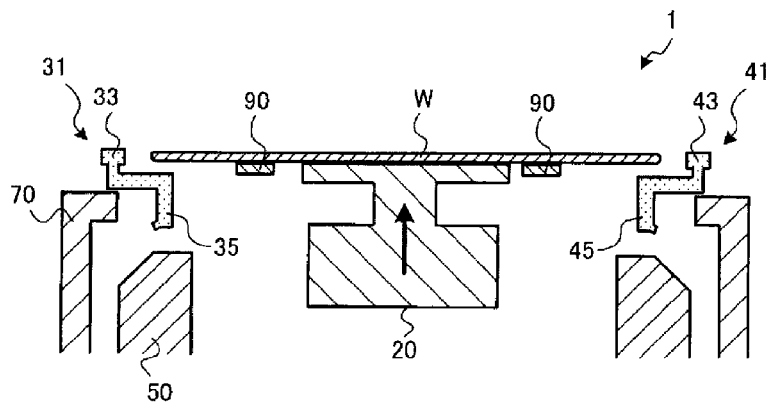
FIG. 6B is a schematic diagram illustrating a process of the substrate processing according to the exemplary embodiment.

Then, as depicted in FIG. 6B, the substrate processing apparatus 1 moves the holder 20 to a raised position, and delivers the wafer W from the transfer arm 90 onto the holder 20, thus allowing the wafer W to be placed on the holder 20. Then, the substrate processing apparatus 1 retreats the transfer arm 90 from the inside of the processing vessel 10.

At this time, the holder 20 discharges a gas toward the wafer W from a gas discharge unit (not shown) of the vacuum chuck 21 (see FIG. 2), thus allowing the wafer W to be slightly moved up from the vacuum chuck 21. Accordingly, when the position of the wafer W is adjusted, the wafer W can be suppressed from having a scratch by being scraped by the vacuum chuck 21.

Further, as shown in FIG. 6B, the position of the wafer W when it is delivered onto the holder 20 from the transfer arm 90 may be on a level with the position adjusting devices 33 and 43.

Figure 6C:
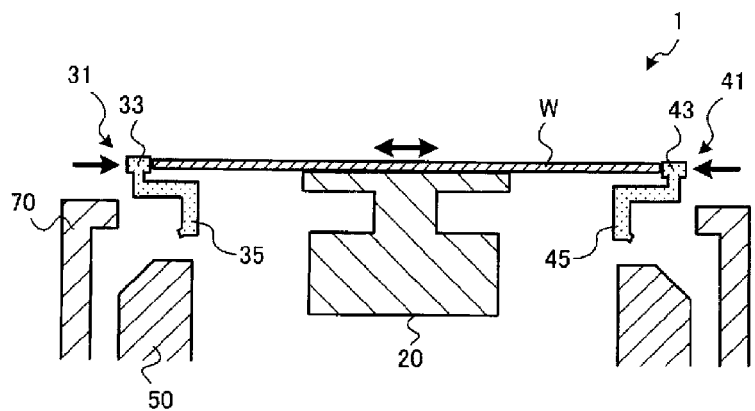
FIG. 6C is a schematic diagram illustrating a process of the substrate processing according to the exemplary embodiment.

Then, as depicted in FIG. 6C, the substrate processing apparatus 1 moves the nozzle arms 31 and 41 inwards, and performs the position adjustment of the wafer W with respect to the holder 20 by using the position adjusting devices 33 and 43 which face each other with the wafer W therebetween. Accordingly, as stated above, the center C2 (see FIG. 5) of the wafer W is aligned to the center C1 (see FIG. 5) of the holder 20.

Upon the completion of this position adjustment, the substrate processing apparatus 1 holds the wafer W with the holder 20. To elaborate, the substrate processing apparatus 1 attracts the wafer W with the vacuum chuck 21 of the holder 20, thus allowing the wafer W to be held by the holder 20.

Figure 6D:
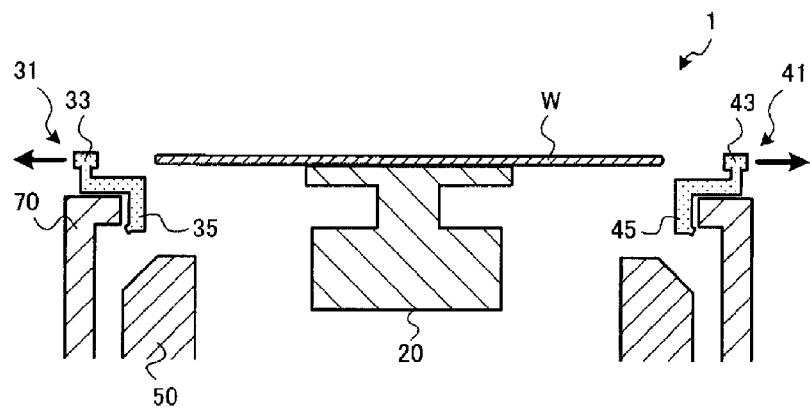
FIG. 6D is a schematic diagram illustrating a process of the substrate processing according to the exemplary embodiment.

Further, as depicted in FIG. 6D, in parallel with this holding process, the substrate processing apparatus 1 moves the nozzle arms 31 and 41 outwards. Accordingly, when the wafer W is lowered, interference between the wafer W and the nozzle arms 31 and 41 can be suppressed.

Figure 6E:
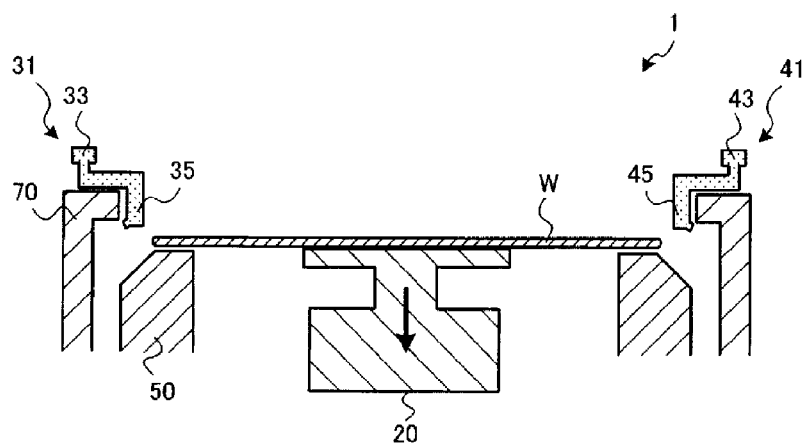
FIG. 6E is a schematic diagram illustrating a process of the substrate processing according to the exemplary embodiment.

Thereafter, as shown in FIG. 6E, the substrate processing apparatus 1 moves the holder 20 to the lowered position. Accordingly, the wafer W is placed lower than the nozzles 35 and 45.

Figure 6F:
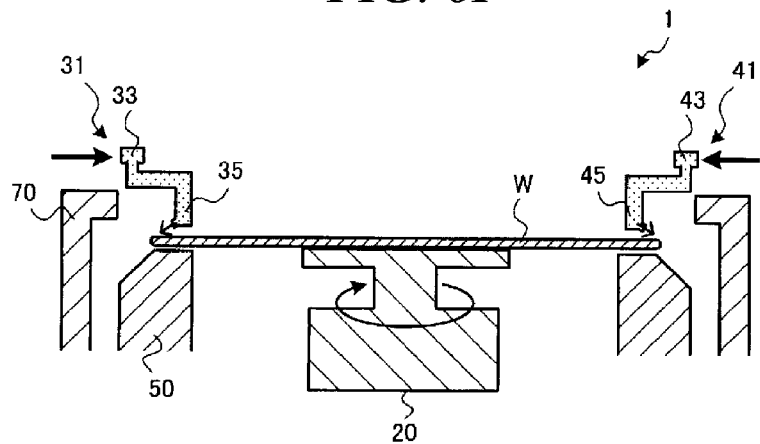
FIG. 6F is a schematic diagram illustrating a process of the substrate processing according to the exemplary embodiment.

Subsequently, as illustrated in FIG. 6F, the substrate processing apparatus 1 rotates the holder 20, and moves the nozzle arms 31 and 41 inwards. That is, the substrate processing apparatus 1 rotates the wafer W, and moves the nozzles 35 and 45 to processing positions for the wafer W (that is, to above the peripheral portion of the wafer W). Then, the substrate processing apparatus 1 discharges the processing liquid from the nozzles 35 and 45, thus etching the peripheral portion of the wafer W.

Here, in the exemplary embodiment, the nozzle 35 and the position adjusting device 33 are provided at the same nozzle arm 31, and the nozzle 45 and the position adjusting device 43 are provided at the same nozzle arm 41. Therefore, there is not caused non-uniformity in relative positions of the nozzles 35 and 45 with respect to the position adjusting devices 33 and 43.

Thus, the position of the wafer W can be accurately adjusted with the position adjusting devices 33 and 43, so that the processing liquid can be discharged to the peripheral portion of the wafer W accurately. As a result, according to the exemplary embodiment, the peripheral portion of the wafer W can be etched with high accuracy.

Further, in the exemplary embodiment, since the nozzle 35 and the position adjusting device 33 are provided at the same nozzle 31 and the nozzle 45 and the position adjusting device 43 are provided at the same nozzle arm 41, the number of arms required in the substrate processing apparatus 1 can be reduced. Thus, according to the exemplary embodiment, the substrate processing apparatus 1 can be made compact.

Furthermore, in the exemplary embodiment, the single nozzle arm 31 having the position adjusting device 33 and the single nozzle arm 41 having the position adjusting device 43 are placed to face each other with the holder 20 therebetween. Accordingly, as shown in FIG. 5, both the position adjusting devices 33 and 43 can be placed on the imaginary line L which passes through the center C1 of the holder 20.

Therefore, according to the exemplary embodiment, the diameter of the wafer W can be estimated accurately by using the position adjusting devices 33 and 43, and, thus, the position adjustment of the wafer W with respect to the holder 20 can be carried out more accurately.

Moreover, in the exemplary embodiment, the position adjusting device 33 is disposed higher than the nozzle 35, and the position adjusting device 43 is disposed higher than the nozzle 45. Accordingly, contamination of the position adjusting devices 33 and 43, which might be caused due to the processing liquid flown to the position adjusting devices 33 and 43 when the processing liquid is discharged toward the wafer W from the nozzles 35 and 45, can be suppressed.

In the exemplary embodiment, as shown in FIG. 5, when viewed from the top, a discharge position P1 of the processing liquid discharged toward the wafer W from a discharge opening 35$f$ (see FIG. 8) of the nozzle 35 (see FIG. 3) needs to be located between the center C2 of the wafer W and the position adjusting device 33.

That is, when viewed from the top, the discharge position P1 needs to be located on the imaginary line L which extends from the center C2 of the wafer W to the position adjusting devices 33 and 43.

As stated above, by allowing the discharge position P1 to lie on the same axis as the position adjusting devices 33 and 43, the processing liquid can be discharged from the nozzle 35 to the peripheral portion of the wafer W more accurately.

Likewise, when viewed from the top, a discharge position P2 of the processing liquid discharged toward the wafer W from a discharge opening of the nozzle 45 (see FIG. 4) needs to be located between the center C2 of the wafer W and the position adjusting device 43.

That is, when viewed from the top, the discharge position P2 needs to be located on the imaginary line L which extends from the center C2 of the wafer W to the position adjusting devices 33 and 43.

As stated above, by allowing the discharge position P2 to lie on the same axis as the position adjusting devices 33 and 43, the processing liquid can be discharged from the nozzle 45 to the peripheral portion of the wafer W more accurately.

<Modification Example of Substrate Processing>

Now, a modification example of the substrate processing will be explained with reference to FIG. 7A to FIG. 7F. FIG. 7A to FIG. 7F are schematic diagrams illustrating individual processes of a substrate processing according to a modification example. Further, in the substrate processing apparatus 1 according to the modification example, the lower cup 50 and the outer cup 70 are configured to be moved up and down along with the nozzle arms 31 and 41.

Figure 7A:
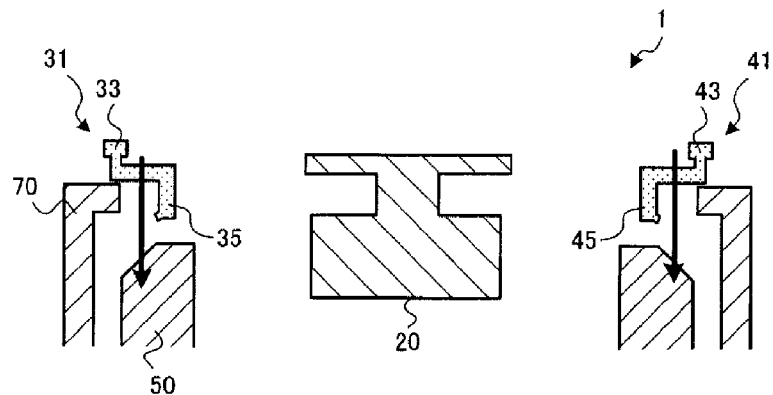
FIG. 7A is a schematic diagram illustrating a process of a substrate processing according to a modification example of the exemplary embodiment.

First, as depicted in FIG. 7A, the substrate processing apparatus 1 moves the nozzle arms 31 and 41, the lower cup 50 and the outer cup 70 to lowered positions. Accordingly, the nozzle arms 31 and 41 can be retreated to the positions where they do not interfere with the wafer W.

Subsequently, by using the transfer arm 90, the substrate processing apparatus 1 carries the wafer W into the processing vessel 10 (see FIG. 1) and places the wafer W on the holder 20. Then, the substrate processing apparatus 1 retreats the transfer arm 90 from the inside of the processing vessel 10.

At this time, the holder 20 discharges the gas toward the wafer W from the gas discharge unit (not shown) of the vacuum chuck 21 (see FIG. 2), allowing the wafer W to be moved up slightly from the vacuum chuck 21. Accordingly, when the position of the wafer W is adjusted, the wafer W can be suppressed from having a scratch by being scraped by the vacuum chuck 21.

Figure 7B:
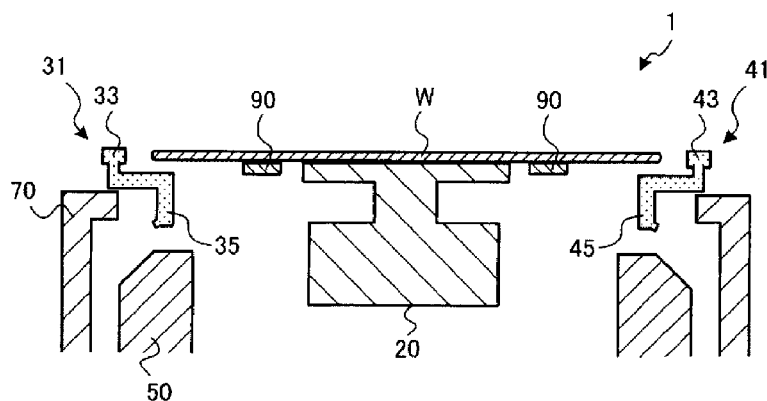
FIG. 7B is a schematic diagram illustrating a process of the substrate processing according to the modification example of the exemplary embodiment.

Further, as shown in FIG. 7B, the position of the wafer W when it is delivered onto the holder 20 from the transfer arm 90 needs to be on a level with the position adjusting devices 33 and 43.

Figure 7C:
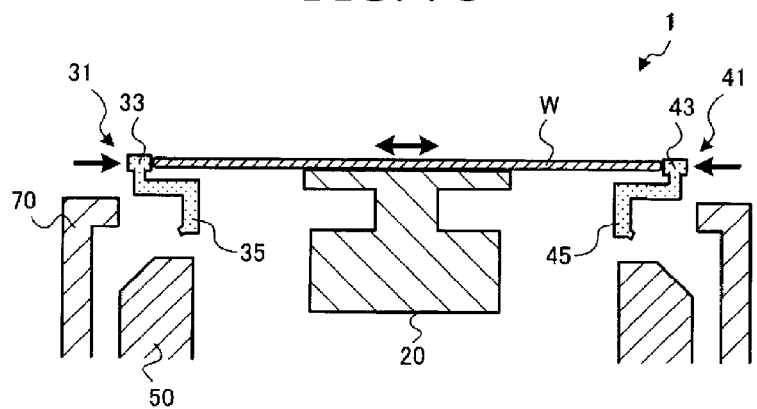
FIG. 7C is a schematic diagram illustrating a process of the substrate processing according to the modification example of the exemplary embodiment.

Thereafter, as illustrated in FIG. 7C, the substrate processing apparatus 1 moves the nozzle arms 31 and 41 inwards, and performs the position adjustment of the wafer W with respect to the holder 20 by using the position adjusting devices 33 and 43 which face each other with the wafer W therebetween. Accordingly, as stated above, the center C2 (see FIG. 5) of the wafer W is aligned to the center C1 (see FIG. 5) of the holder 20.

Upon the completion of this position adjustment, the substrate processing apparatus 1 holds the wafer W with the holder 20. To elaborate, the substrate processing apparatus 1 attracts the wafer W with the vacuum chuck 21 of the holder 20, thus allowing the wafer W to be held by the holder 20.

Figure 7D:
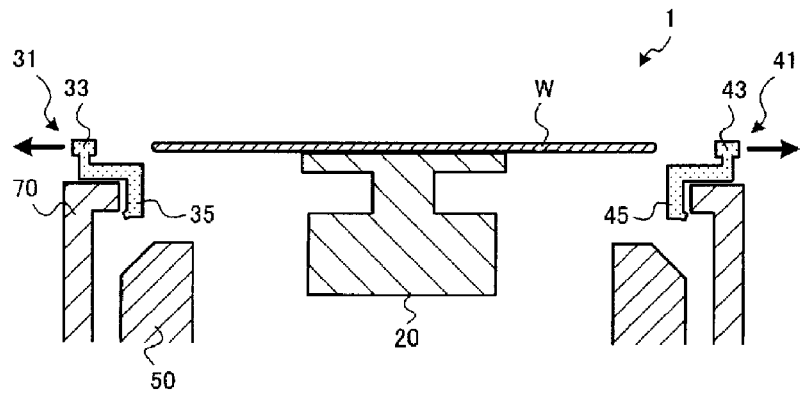
FIG. 7D is a schematic diagram illustrating a process of the substrate processing according to the modification example of the exemplary embodiment.

Further, as depicted in FIG. 7D, in parallel with this holding process, the substrate processing apparatus 1 moves the nozzle arms 31 and 41 outwards. Accordingly, when the nozzle arms 31 and 41 are raised, the interference between the wafer W and the nozzle arms 31 and 41 can be suppressed.

Figure 7E:
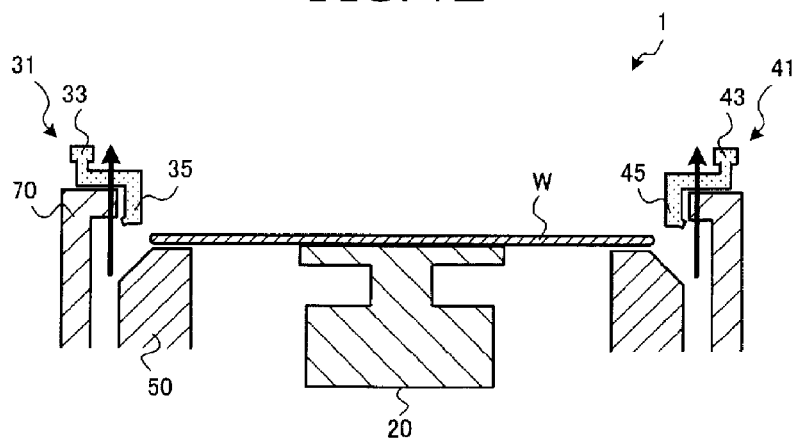
FIG. 7E is a schematic diagram illustrating a process of the substrate processing according to the modification example of the exemplary embodiment.

Then, as illustrated in FIG. 7E, the substrate processing apparatus 1 moves the nozzle arms 31 and 41, the lower cup 50 and the outer cup 70 to raised positions. Accordingly, the wafer W is located lower than the nozzles 35 and 45.

Figure 7F:
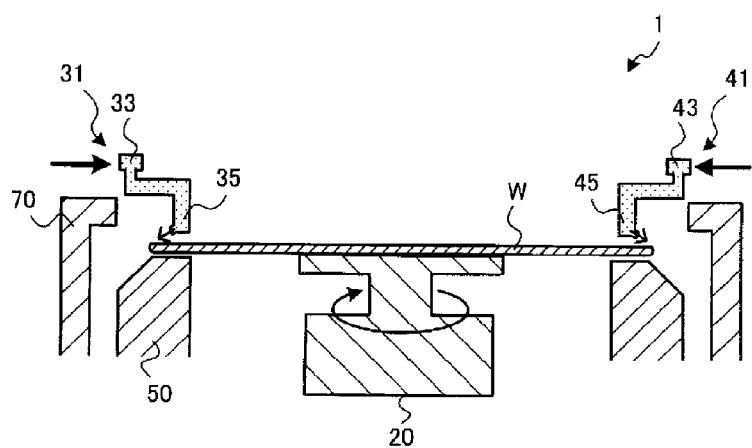
FIG. 7F is a schematic diagram illustrating a process of the substrate processing according to the modification example of the exemplary embodiment.

Thereafter, as shown in FIG. 7F, the substrate processing apparatus 1 rotates the holder 20, and moves the nozzle arms 31 and 41 inwards. That is, the substrate processing apparatus 1 rotates the wafer W, and moves the nozzles 35 and 45 to the processing positions for the wafer W (that is, to above the peripheral portion of the wafer W). Then, the substrate processing apparatus 1 discharges the processing liquid from the nozzles 35 and 45, thus etching the peripheral portion of the wafer W.

In this modification example, as in the exemplary embodiment, the nozzle 35 and the position adjusting device 33 are provided at the same nozzle arm 31, and the nozzle 45 and the position adjusting device 43 are provided at the same nozzle arm 41. Accordingly, there is not caused the non-uniformity in relative positions of the nozzles 35 and 45 with respect to the position adjusting device 33 and 43.

Thus, since the position adjustment of the wafer W is carried out accurately by using the position adjusting devices 33 and 43, the processing liquid can be discharged to the peripheral portion of the wafer W with high accuracy. Therefore, according to the modification example, the peripheral portion of the wafer W can be etched with high accuracy.

<Configuration of Nozzle>

Figure 8:
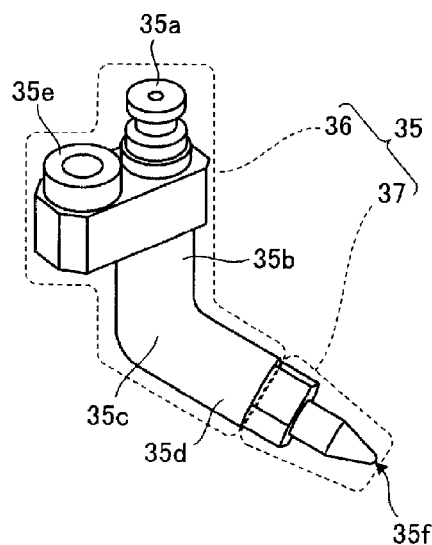
FIG. 8 is a perspective view illustrating a configuration of a nozzle according to the exemplary embodiment.
Figure 9:
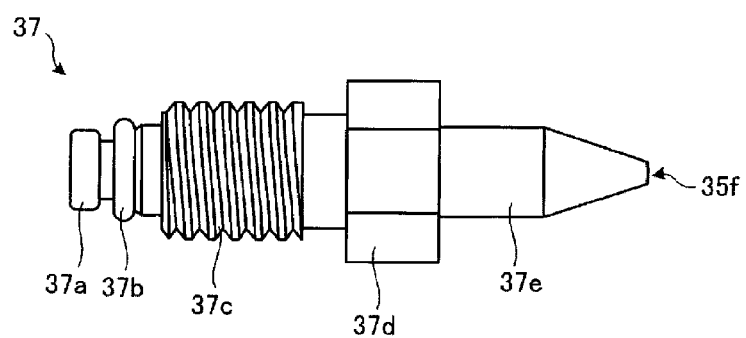
FIG. 9 is a schematic diagram illustrating a configuration of a nozzle tip according to the exemplary embodiment.
Figure 10:
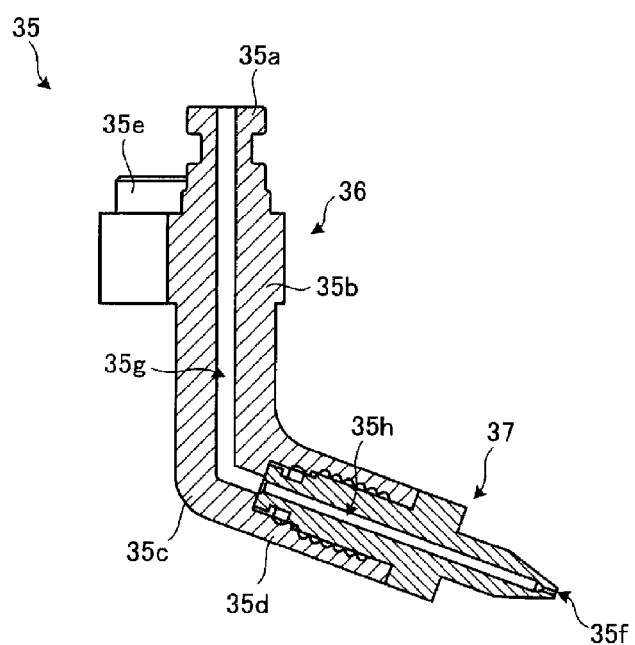
FIG. 10 is a cross sectional view illustrating an internal configuration of the nozzle according to the exemplary embodiment.

Now, a configuration of the nozzles 35 and 45 according to the exemplary embodiment will be explained with reference to FIG. 8 to FIG. 10. FIG. 8 is a perspective view illustrating the configuration of the nozzle 35 according to the exemplary embodiment; FIG. 9 is a schematic diagram illustrating a configuration of a nozzle tip 37 according to the exemplary embodiment; and FIG. 10 is a cross sectional view illustrating an internal configuration of the nozzle 35 according to the exemplary embodiment.

Since the nozzle 45 has the same configuration as the nozzle 35, description of the configuration of the nozzle 45 will be omitted here.

As shown in FIG. 8, the nozzle 35 includes a main body 36 and the nozzle tip 37, and has, as a whole, a shape bent at an obtuse angle. The nozzle tip 37 is an example of a discharge opening member, and configured to be detachable from the main body 36.

Further, the nozzle 35 has a connection part 35a, a vertical part 35b, a curved part 35c, an extension part 35d and a fixing part 35e provided at the main body 36, and, also, has the discharge opening 35f provided at the nozzle tip 37.

The connection part 35a is configured to be connected to the liquid supply 32. The vertical part 35b is a portion extending vertically downwards from the connection part 35a. The curved part 35c is a portion diagonally curved from the vertical part 35b. The extension part 35d is a portion extending diagonally downwards from the curved part 35c.

The fixing part 35e has a mounting hole or the like, and can be fixed to the liquid supply 32 by using this mounting hole. The discharge opening 35f is provided at a leading end of the extension part 35d (that is, a leading end of the nozzle 35), and the processing liquid supplied from the liquid supply 32 is discharged through this discharge opening 35f.

As depicted in FIG. 9, the nozzle tip 37 has a connection part 37a, an O-ring 37b, a screw-coupling part 37c, a grip part 37d and an extension part 37e. The connection part 37a is configured to be connected, in the extension part 35d of the main body 36, to a first path 35g (see FIG. 10) which is formed within the main body 36.

The O-ring 37b suppresses the processing liquid flowing from the first path 35g from leaking to the outside when the connecting part 37a is connected to this first path 35g within the main body 36. The screw-coupling part 37c is, by way of example, a male screw and screwed into a female screw formed at the main body 36.

The grip part 37d is a portion gripped by a fastening member such as a spanner when the nozzle tip 37 is connected to the main body 36. The extension part 37e is a portion extending from the grip part 37d to the discharge opening 35f.

As shown in FIG. 10, the nozzle 35 is provided with the first path 35g formed within the main body 36 and a second path 35h formed within the nozzle tip 37. The first path 35g and the second path 35h are connected within the nozzle 35.

Here, in the nozzle 35 according to the exemplary embodiment, the extension part 35d is provided between the curved part 35c and the discharge opening 35f. Accordingly, a distance between the curved part 35c and the discharge opening 35f can be lengthened.

Thus, according to the exemplary embodiment, a flow of the processing liquid discharged from the discharge opening 35f can be suppressed from being disturbed by a vortex or the like generated when the flow of the processing liquid is bent in the curved part 35c.

Further, in the exemplary embodiment, the nozzle tip 37 is configured to be detachable from the extension part 35d of the nozzle 35. Thus, when the discharge opening 35f of the nozzle 35 is clogged with the processing liquid, the problem can be solved easily by replacing the nozzle tip 37.

Furthermore, in the exemplary embodiment, as shown in FIG. 10, the second path 35h formed in the nozzle tip 37 is thinner than the first path 35g formed in the main body 36. That is, the first path 35g is thicker than the second path 35h. Accordingly, when the processing liquid flows in the first path 35g within the main body 36, a pressure loss applied to the processing liquid can be reduced.

Moreover, since the discharge of the processing liquid can be made as thin as possible when it is discharged from the nozzle tip 37, it is possible to discharge the processing liquid, aiming at the narrower discharge position P1.

In addition, in the nozzle tip 37 according to the exemplary embodiment, the main body 36 and the nozzle tip 37 are configured as separate bodies. Here, in case of forming a path which is bent inside, like the path passing through the curved part 35c, this path may not be formed unless it is thick to some extent.

Furthermore, if the main body 36 and the nozzle tip 37 are formed as a single body, the path passing through the extension part 35d and the discharge opening 35f need to be formed at the same time as the path passing through the curved part 35c. Accordingly, if the main body 36 and the nozzle tip 37 are formed as the single body, it is difficult to form the path passing through the extension part 35d and the discharge opening 35f to be thin.

Meanwhile, in the nozzle tip 37 according to the exemplary embodiment, since the main body 36 and the nozzle tip 37 are configured as the separate bodies, the path passing through the main body 36 and the path passing through the nozzle tip 37 need not be formed at the same time.

Thus, even when the path passing through the main body 36 is formed to be thick, the path of the nozzle tip 37 can be formed to be thin.

Further, since the nozzle tip 37 is formed to have a straight shape, the path passing through the nozzle tip 37 also needs to be of a straight shape. Thus, the thin path can be formed easily.

The substrate processing apparatus 1 according to the exemplary embodiment is equipped with the holder 20, the nozzle arm 31 (41) and the position adjusting device 33 (43). The holder 20 holds the substrate (wafer W). The nozzle arm 31 (41) has the nozzle 35 (45) which is configured to supply the processing liquid to the peripheral portion of the substrate (wafer W). The position adjusting device 33 (43) is provided at the nozzle arm 31 (41) and adjusts the position (center C2) of the substrate (wafer W) to the given position (center C1) of the holder 20. Accordingly, the peripheral portion of the wafer W can be etched with high accuracy.

Further, the substrate processing apparatus 1 according to the exemplary embodiment is equipped with the single pair of nozzle arms 31 and 41. The nozzle arms 31 and 41 are equipped with the position adjusting devices 33 and 43, respectively, and disposed to face each other with the holder 20 therebetween. Accordingly, the position adjustment of the wafer W with respect to the holder 20 can be carried out accurately.

Furthermore, in the substrate processing apparatus 1, the position adjusting device 33 (43) is disposed above the nozzle 35 (45). Therefore, contamination of the position adjusting device 33 (43) caused by the processing liquid discharged from the nozzle 35 (45) can be suppressed.

In addition, in the substrate processing apparatus 1 according to the exemplary embodiment, the discharge position P1 (P2) of the processing liquid discharged to the substrate (wafer W) from the discharge opening 35f of the nozzle 35 (45) is located between the center C2 of the substrate (wafer W) and the position adjusting device 33 (43), when viewed from the top. Accordingly, the processing liquid can be discharged to the peripheral portion of the wafer W from the nozzle 35 (45) with higher accuracy.

Moreover, in the substrate processing apparatus 1 according to the exemplary embodiment, the nozzle 35 (45) has the curved part 35c provided between the connection part 35a to the nozzle arm 31 (41) and the discharge opening 35f for the processing liquid; and the extension part 35d extending from the curved part 35c to the discharge opening 35f. Accordingly, the flow of the processing liquid discharged from the discharge opening 35f can be suppressed from being disturbed by the vortex or the like which is generated when the flow of the processing liquid is bent in the curved part 35c.

Further, in the substrate processing apparatus 1 according to the exemplary embodiment, the nozzle 35 has the discharge opening member (nozzle tip 37) which is attachable to/detachable from the extension part 35d. Accordingly, when the discharge opening 35f of the nozzle 35 is clogged with the processing liquid, the problem can be solved easily by replacing the nozzle tip 37.

Furthermore, in the substrate processing apparatus 1 according to the exemplary embodiment, the path (second path 35h) formed at the discharge opening member (nozzle tip 37) is thinner than the path (second path 35g) formed at the part (main body 36) of the nozzle 35 other than the discharge opening member (nozzle tip 37). Accordingly, the pressure loss can be reduced when the processing liquid flows within the main body 36. In addition, since the processing liquid can be made as thin as possible when it is discharged from the nozzle tip 37, it is possible to discharge the processing liquid, aiming at the narrower discharge position P1.

Moreover, the substrate processing apparatus 1 according to the exemplary embodiment is further equipped with the controller 101 configured to control the holder 20, the nozzle arm 31 (41) and the position adjusting device 33 (43). When the holder 20 is placed at the raised position, the controller 101 performs the position adjustment of the substrate (wafer W) to be placed on the holder 20, by moving the nozzle arm 31 (41) in the horizontal direction. Further, when the holder 20 is placed at the lower position, the controller 101 performs the liquid processing of the substrate (wafer w) placed on the holder 20, by moving the nozzle arm 31 (41) to the processing position. Accordingly, the peripheral portion of the wafer W can be etched accurately.

In addition, the substrate processing apparatus 1 according to the exemplary embodiment is further equipped with the controller 101 configured to control the holder 20, the nozzle arm 31 (41) and the position adjusting device 33 (43). When the nozzle arm 31 (41) is placed at the lowered position, the controller 101 performs the position adjustment of the substrate (wafer W) held on the holder 20, by moving the nozzle arm 31 (41) in the horizontal direction. Further, when the nozzle arm 31 (41) is placed at the raised position, the controller 101 performs the liquid processing of the substrate (wafer W) placed on the holder 20, by moving the nozzle arm 31 (41) to the processing position. Accordingly, the peripheral portion of the wafer W can be etched accurately.

<Sequence of Substrate Processing>

Figure 11:
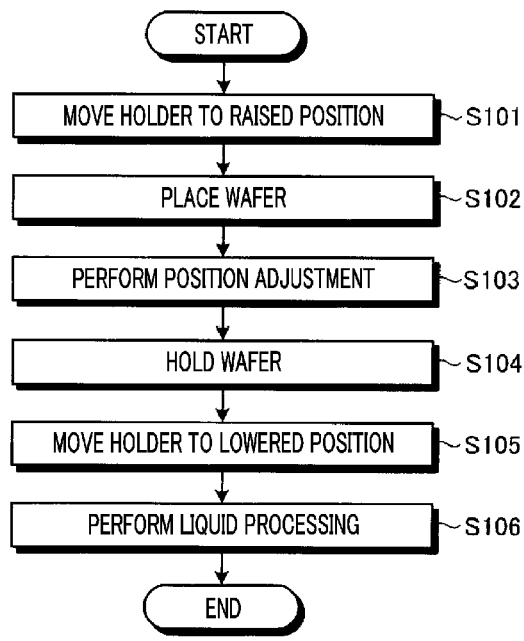
FIG. 11 is a flowchart illustrating a sequence of the substrate processing performed by the substrate processing apparatus according to the exemplary embodiment.

Now, a sequence of the substrate processings according to the exemplary embodiment and the modification example will be explained with reference to FIG. 11 and FIG. 12. FIG. 11 is a flowchart illustrating the substrate processing performed by the substrate processing apparatus 1 according to the exemplary embodiment.

First, the controller 101 moves the holder 20 to the raised position (process S101). Then, the controller 101 places the wafer W on the vacuum chuck 21 of the holder 20 by controlling the transfer arm 90 and the holder 20 (process S102).

Thereafter, the controller 101 locates the position adjusting devices 33 and 43 to face each other with the wafer W therebetween by controlling the nozzle arms 31 and 41 and the holder 20, and performs the position adjustment of the wafer W with respect to the holder 20 (process S103).

Then, the controller 101 holds the wafer W with the vacuum chuck 21 by controlling the holder 20 (process S104). Thereafter, the controller 101 moves the holder 20 to the lowered position (process S105).

Finally, the controller 101 moves the nozzles 35 and 45 close to the peripheral portion of the wafer W by controlling the nozzle arms 31 and 41 and the holder 20, and performs the liquid processing upon the peripheral portion of the wafer W (process S106). Upon the completion of this process S106, the series of processes of the substrate processing are completed.

Figure 12:
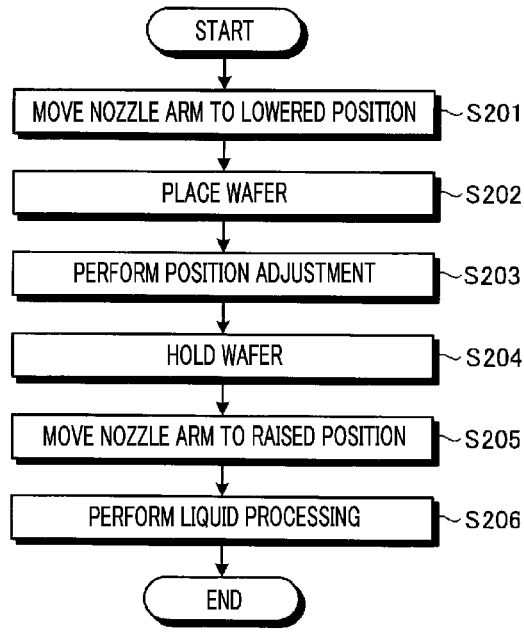
FIG. 12 is a flowchart illustrating a sequence of the substrate processing performed by the substrate processing apparatus according to the modification example of the exemplary embodiment.

FIG. 12 is a flowchart illustrating the substrate processing performed by the substrate processing apparatus 1 according to the modification example of the exemplary embodiment.

First, the controller 101 moves the nozzle arms 31 and 41 to the lowered position (process S201). Further, in the process S201, the controller 101 moves the nozzle arms 31 and 41, the lower cup 50 and the outer cup 70 to the lowered positions at once.

Subsequently, the controller 101 places the wafer W on the vacuum chuck 21 of the holder 20 by controlling the transfer arm 90 and the holder 20 (process S202). Then, by controlling the nozzle arms 31 and 41 and the holder 20, the controller 101 locates the position adjusting devices 33 and 43 to face each other with the wafer W therebetween, and performs the position adjustment of the wafer W with respect to the holder 20 (process S203).

Thereafter, the controller 101 holds the wafer W with the vacuum chuck 21 by controlling the holder 20 (process S204). Then, the controller 101 raises the nozzle arms 31 and 41 (process S205). In this process S205, the nozzle arms 31 and 41, the lower cup 50 and the outer cup 70 are raised at once.

Finally, the controller 101 moves the nozzles 35 and 45 close to the peripheral portion of the wafer W by controlling the nozzle arms 31 and 41 and the holder 20, and performs the liquid processing upon the peripheral portion of the wafer W (process S206). Upon the completion of this process S206, the series of processes of the substrate processing are completed.

A substrate processing method according to the exemplary embodiment includes the placing process S102 (S202), the adjusting process S103 (S203), the holding process S104 (S204) and the processing process S106 (S206). In the placing process S102 (S202), the substrate (wafer W) is placed on the holder 20. In the adjusting process S103 (S203), the position (center C2) of the substrate (wafer W) is aligned to the given position (center C1) of the holder 20 by using the position adjusting device 33 (43) provided at the nozzle arm 31 (41). In the holding process S104 (S204), the substrate (wafer W) is held by the holder 20. In the processing process S106 (S206), the peripheral portion of the substrate (wafer W) is processed by the processing liquid supplied from the nozzle 35 (45) provided at the nozzle arm 31 (41). Accordingly, the peripheral portion of the wafer W can be etched with high accuracy.

Further, the substrate processing method according to the exemplary embodiment further includes, prior to the adjusting process S103, the process S101 of moving the holder 20 to the raised position. Further, the substrate processing method according to the exemplary embodiment further includes, after the adjusting process S103, the process S105 of moving the holder 20 to the lowered position. Accordingly, the contamination of the position adjusting devices 33 and 43 can be suppressed.

Moreover, the substrate processing method according to the exemplary embodiment further includes, prior to the adjusting process S203, the process S201 of moving the nozzle arm 31 (41) to the lowered position. Further, the substrate processing method according to the exemplary embodiment further includes, after the adjusting process S203, the process S205 of moving the nozzle arm 31 (41) to the raised position. Accordingly, the contamination of the position adjusting devices 33 and 43 can be suppressed.

So far, the exemplary embodiments have been described. However, the present disclosure is not limited to the exemplary embodiments, and various changes and modifications may be made without departing from the spirit of the present disclosure. By way of example, the above exemplary embodiments have been described for the case where the substrate processing apparatus 1 is equipped with the two nozzle arms each having the nozzle and the position adjusting device. However, the number of the nozzle arms having both the nozzle and the position adjusting device may not necessarily be two.

By way of example, the substrate processing apparatus 1 may be equipped with a single nozzle arm having both the nozzle and the position adjusting device and a single arm only having the position adjusting device. Further, the substrate processing apparatus 1 may be equipped with a single nozzle arm having both the nozzle and the position adjusting device and a single nozzle arm only having the nozzle.

Furthermore, the substrate processing apparatus 1 may be equipped with a single nozzle arm having both the nozzle and the position adjusting device, a single arm only having the position adjusting device and a single nozzle arm only having the nozzle.

According to the exemplary embodiment, it is possible to etch the peripheral portion of the substrate with high accuracy.

Furthermore, it should be noted that the above-described exemplary embodiments are illustrative in all aspects and are not anyway limiting. The above-described exemplary embodiments may be omitted, replaced and modified in various ways without departing from the scope and the spirit of claims.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
   a holder configured to hold a substrate;
   a nozzle arm comprising a nozzle configured to supply a processing liquid to a peripheral portion of the substrate; and
   a position adjusting device supported by the nozzle arm and configured to adjust a position of the substrate to a given position on the holder,
   wherein the nozzle and the position adjusting device are provided at the same nozzle arm, and
   the nozzle is disposed to extend from a processing liquid supply, which is located next to the position adjusting device, to a position between the position adjusting device and the substrate.

2. The substrate processing apparatus of claim 1,
wherein the nozzle arm includes a pair of nozzle arms, and
each of the pair of nozzle arms comprises the position adjusting device, and the pair of nozzle arms are placed to face each other with the holder therebetween.

3. The substrate processing apparatus of claim 2,
wherein the position adjusting device is disposed higher than the nozzle.

4. The substrate processing apparatus of claim 2,
wherein a discharge position of the processing liquid discharged to the substrate from a discharge opening of the nozzle is located between a center of the substrate and the position adjusting device, when viewed from a top.

5. The substrate processing apparatus of claim 2,
wherein the nozzle comprises:
a curved part provided between a connection part to the nozzle arm and a discharge opening through which the processing liquid is discharged; and
an extension part extending from the curved part to the discharge opening.

6. The substrate processing apparatus of claim 2, further comprising:
a controller configured to control the holder, the nozzle arm and the position adjusting device,
wherein when the holder is placed at a raised position, the controller moves the nozzle arm in a horizontal direction to perform a position adjustment of the substrate placed on the holder, and
when the holder is placed at a lowered position, the controller moves the nozzle arm to a processing position to perform a liquid processing on the substrate placed on the holder.

7. The substrate processing apparatus of claim 2, further comprising:
a controller configured to control the holder, the nozzle arm and the position adjusting device,
wherein when the nozzle arm is placed at a lowered position, the controller moves the nozzle arm in a horizontal direction to perform a position adjustment of the substrate placed on the holder, and
when the nozzle arm is placed at a raised position, the controller moves the nozzle arm to a processing position to perform a liquid processing on the substrate placed on the holder.

8. The substrate processing apparatus of claim 1,
wherein the position adjusting device is disposed higher than the nozzle.

9. The substrate processing apparatus of claim 8,
wherein a discharge position of the processing liquid discharged to the substrate from a discharge opening of the nozzle is located between a center of the substrate and the position adjusting device, when viewed from a top.

10. The substrate processing apparatus of claim 8,
wherein the nozzle comprises:
a curved part provided between a connection part to the nozzle arm and a discharge opening through which the processing liquid is discharged; and
an extension part extending from the curved part to the discharge opening.

11. The substrate processing apparatus of claim 1,
wherein a discharge position of the processing liquid discharged to the substrate from a discharge opening of the nozzle is located between a center of the substrate and the position adjusting device, when viewed from a top.

12. The substrate processing apparatus of claim 11,
wherein the nozzle comprises:
a curved part provided between a connection part to the nozzle arm and the discharge opening through which the processing liquid is discharged; and
an extension part extending from the curved part to the discharge opening.

13. The substrate processing apparatus of claim 1,
wherein the nozzle comprises:
a curved part provided between a connection part to the nozzle arm and a discharge opening through which the processing liquid is discharged; and
an extension part extending from the curved part to the discharge opening.

14. The substrate processing apparatus of claim 13,
wherein the nozzle comprises a discharge opening member configured to be attached to/detached from the extension part.

15. The substrate processing apparatus of claim 14,
wherein a path formed in the discharge opening member is thinner than a path formed in a part of the nozzle other than the discharge opening member.

16. The substrate processing apparatus of claim 1, further comprising:
a controller configured to control the holder, the nozzle arm and the position adjusting device,
wherein when the holder is placed at a raised position, the controller moves the nozzle arm in a horizontal direction to perform a position adjustment of the substrate placed on the holder, and
when the holder is placed at a lowered position, the controller moves the nozzle arm to a processing position to perform a liquid processing on the substrate placed on the holder.

17. The substrate processing apparatus of claim 1, further comprising:
a controller configured to control the holder, the nozzle arm and the position adjusting device,
wherein when the nozzle arm is placed at a lowered position, the controller moves the nozzle arm in a horizontal direction to perform a position adjustment of the substrate placed on the holder, and
when the nozzle arm is placed at a raised position, the controller moves the nozzle arm to a processing position to perform a liquid processing on the substrate placed on the holder.

18. The substrate processing apparatus of claim 1,
wherein the position adjusting device has direct contact with the substrate.

19. A substrate processing method, comprising:
placing a substrate on a holder;
adjusting a position of the substrate to a given position on the holder by using a position adjusting device supported by a nozzle arm;
holding the substrate by the holder; and
processing a peripheral portion of the substrate with a processing liquid supplied from a nozzle which is provided at the nozzle arm,
wherein the nozzle and the position adjusting device are provided at the same nozzle arm, and
the nozzle is disposed to extend from a processing liquid supply, which is located next to the position adjusting device, to a position between the position adjusting device and the substrate.

20. The substrate processing method of claim 19, further comprising:
  moving the holder to a raised position before the adjusting of the position of the substrate to the given position; and
  moving the holder to a lowered position after the adjusting of the position of the substrate to the given position.

21. The substrate processing method of claim 19, further comprising:
  moving the nozzle arm to a lowered position before the adjusting of the position of the substrate to the given position; and
  moving the nozzle arm to a raised position after the adjusting of the position of the substrate to the given position.

* * * * *

UNITED STATES PATENT AND TRADEMARK OFFICE
CERTIFICATE OF CORRECTION

PATENT NO. : 12,142,496 B2
APPLICATION NO. : 15/930561
DATED : November 12, 2024
INVENTOR(S) : Yoshifumi Amano et al.

Page 1 of 1

It is certified that error appears in the above-identified patent and that said Letters Patent is hereby corrected as shown below:

In the Specification

Column 8, Line 16, "33band" should be -- 33b and --.

Signed and Sealed this
Fourth Day of March, 2025

Coke Morgan Stewart
*Acting Director of the United States Patent and Trademark Office*